United States Patent [19]
Gibbons

[11] 4,219,830
[45] Aug. 26, 1980

[54] SEMICONDUCTOR SOLAR CELL
[76] Inventor: James F. Gibbons, 320 Tennyson Ave., Palo Alto, Calif. 94301
[21] Appl. No.: 916,833
[22] Filed: Jun. 19, 1978
[51] Int. Cl.² .............................................. H01L 27/14
[52] U.S. Cl. ...................................... 357/30; 357/20; 357/88; 357/89
[58] Field of Search ........................ 357/30, 20, 88, 89
[56] References Cited
U.S. PATENT DOCUMENTS

| 4,001,864 | 1/1977 | Gibbons | 357/30 |
| 4,107,722 | 8/1978 | Chamberlain | 357/30 |
| 4,116,717 | 9/1978 | Rahilly | 136/89 |
| 4,142,200 | 2/1979 | Mizushima | 357/30 |

Primary Examiner—Martin H. Edlow
Attorney, Agent, or Firm—Flehr, Hohbach, Test

[57] ABSTRACT

There is described a semiconductor solar cell of improved efficiency. The cell has a built-in electric field which extends from the surface of the cell to the interior to keep minority carriers away from the surface whereby recombination at the surface is reduced. Interior contacts are provided whereby current flow along the surface of the device to contacts is avoided to reduce surface resistance and recombination.

7 Claims, 8 Drawing Figures

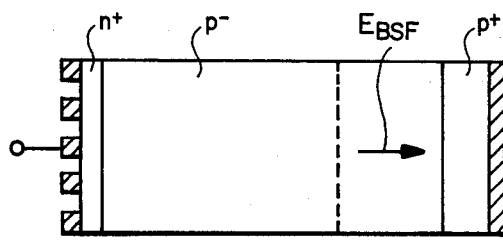
FIG_1
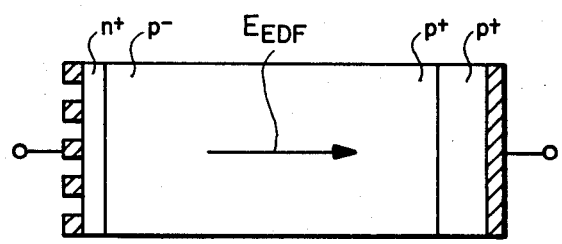
FIG_3
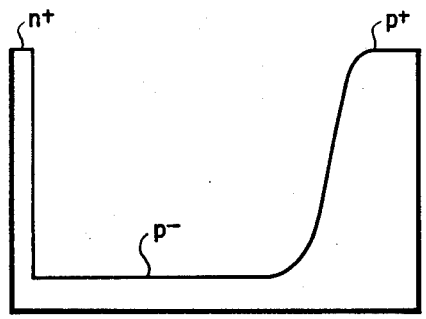
FIG_2
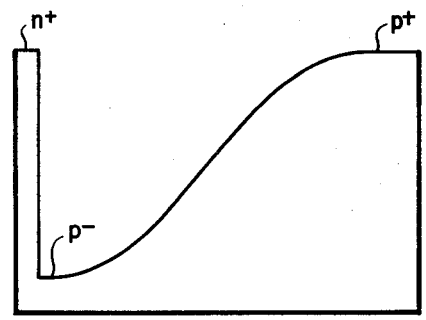
FIG_4
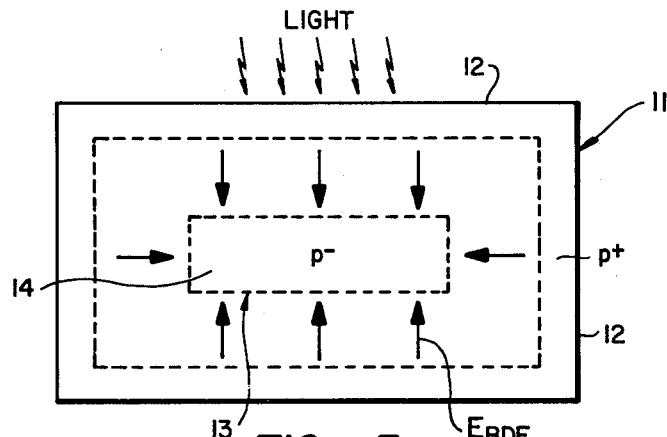
FIG_5
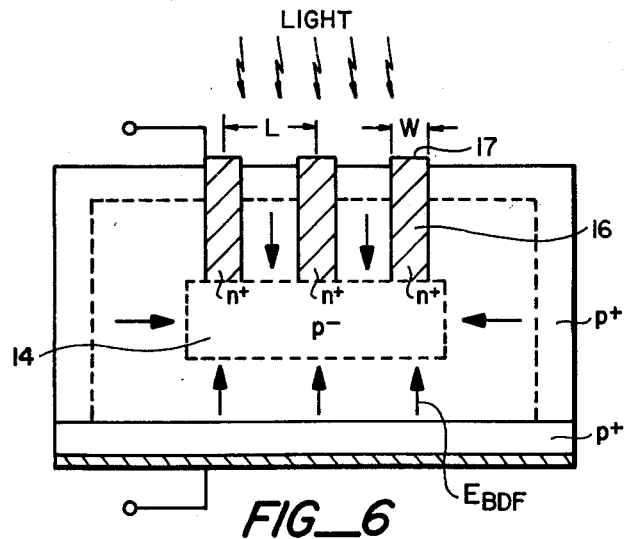
FIG_6

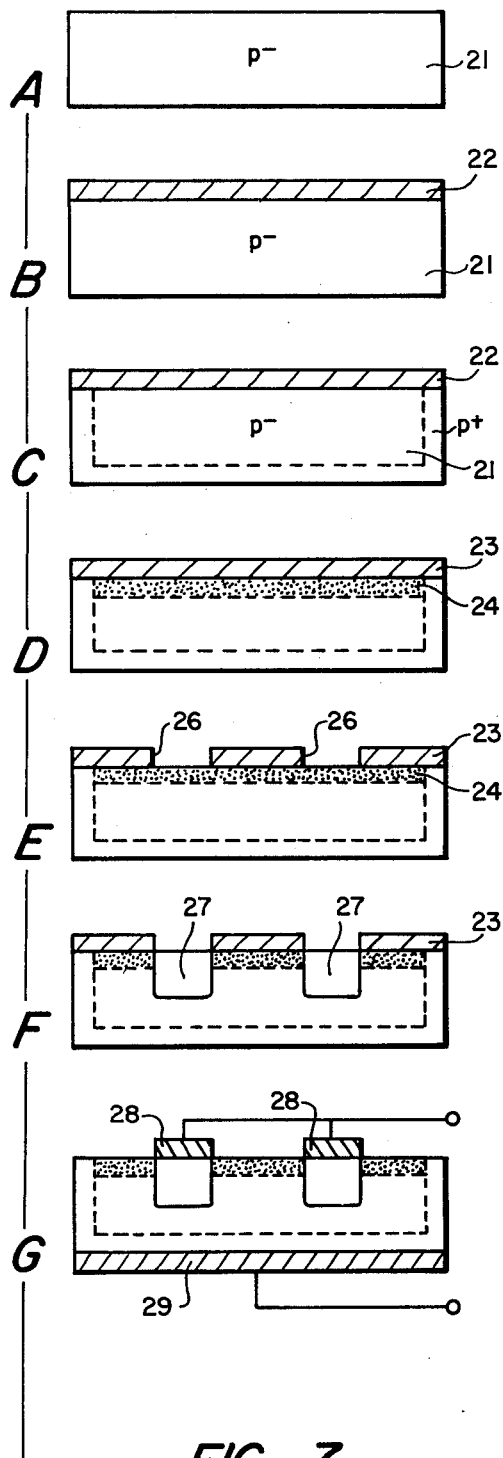
FIG_7
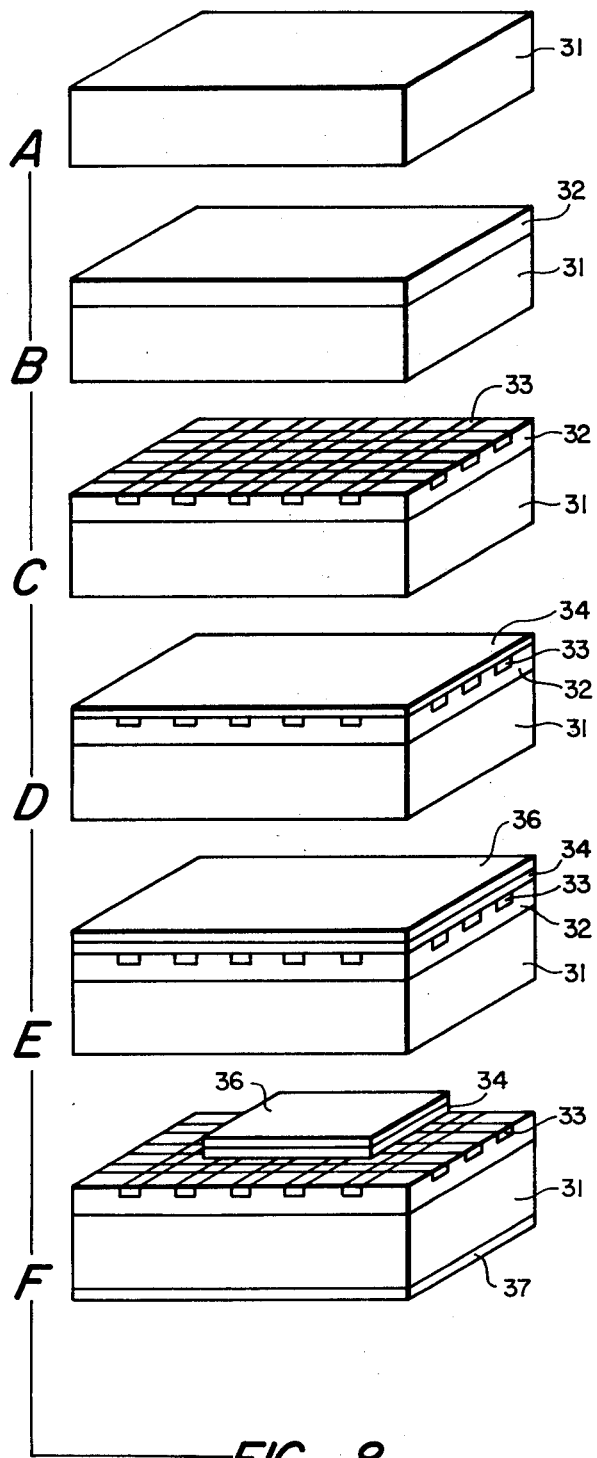
FIG_8

SEMICONDUCTOR SOLAR CELL

BACKGROUND OF THE INVENTION

This invention relates generally to solar cells and more particularly to a semiconductor solar cell including a p-n junction and having means for minimizing surface effects such as surface recombination and resistance.

To understand the invention clearly, it is first useful to describe prior art devices. In FIG. 1, there is shown a prior art solar cell which includes a heavily doped n-type (n+) emitter fabricated on a lightly doped p-type (p−) body. The cell has a heavily doped p-type (p+) back contact region and a graded p-type layer extending from the back contact into the cell interior or body. The impurity concentration of the cell is shown schematically in FIG. 2. This graded p-type layer produces an electric field $E_{BSF}$ at the back surface directed in such a way as to force electrons in the graded region back into the body of the cell. Hence, electrons that are either generated in the graded region by the incident light or diffused into the graded region from the cell body are forced back into the body of the cell rather than being permitted to travel to the p+ contact. Since the electron lifetime is very low in the p+ contact region whereas the electron lifetime is higher in the p− body the back surface field redirects the electrons near the p+ contact from regions of low lifetime into regions of high lifetime. This then increases the effective lifetime of electrons and, therefore, increases the probability of collecting them in a suitably placed n-type contact on the surface.

In cells of the type shown in FIG. 1, the n+ contact is made by diffusing or ion implanting an n+ layer on the surface of the cell that is exposed to light. In order to be collected and contribute to the output current, electrons generated in the body of the cell must diffuse to the n+ layer. The back surface field aids in this process by keeping the electrons away from the p+ contact where electron recombination is high. However, diffusion transport through the body of the cell is still required for electrons to reach the n+ layer and electron lifetime in the body of the cell, while larger than the electron lifetime near the p+ contact, may still be sufficiently low that many electrons recombine before they can diffuse to the n+ layer.

The problem of electron recombination in the cell body can be minimized by using an extended drift field $E_{EDF}$ in the body of the cell. An extended drift field device is illustrated in FIG. 3. The device includes a graded p-type doped region which extends substantially across the body of the cell. The extended p-type doping gradient produces the electric field $E_{EDF}$ which causes electrons to be transported efficiently from the body to the n+ layer despite low carrier lifetime in the cell body. The impurity concentration of the cell is shown schematically in FIG. 4. Reference is made to my U.S. Pat. No. 4,001,864 which describes solar cells including extended electric fields at the p-n junction cell for extracting the photo-generated carriers. The back surface electric field $E_{BSF}$ minimizes the deleterious effects of low electron lifetime near the p+ contact and the extended drift field $E_{EDF}$ in the body minimizes the effect of low electron lifetime in the cell of the body.

However, even with the introduction of these drift fields, there exists surface effects at the n+ surface of the device which reduce the efficiency and introduce series resistance. Holes generated in the n+ layer must be transported efficiently to the p+ contact. The electric fields $E_{EDF}$ and $E_{BSF}$ generated by the doping gradients just mentioned provide efficient transport to the p+ contact for holes that are generated in these regions. But holes that are generated in the n+ layer are in a region where the hole lifetime is low and hence holes recombine quickly in the n+ layer. This effect can be minimized by making the n+ layer relatively thin. However, deleterious effects also arise when the n+ layer is made too thin. The problem is then that electrons reaching the n+ layer from the cell body must flow along the n+ layer to the external contacts of the device. This lateral flow of electrons in the n+ layer introduces resistance into the device. This internal resistance absorbs part of the power that is generated in the device and, therefore, reduces the cell power output. A heavily doped n+ layer will reduce the internal resistance but at the same time not permit holes to diffuse to the cell body because hole lifetime in the n+ contact is lower with higher doping concentration. A more lightly doped n+ layer, or a graded n+ layer, can be used, but then the lateral resistance of the layer increases. Hence, the requirements of low cell resistance and efficient collection of both types of carriers are in conflict at the front surface of the prior art devices.

OBJECTS AND SUMMARY OF THE INVENTION

It is, therefore, a general object of the present invention to provide a semiconductor solar cell device in which surface effects are minimized.

It is another object of the present invention to provide a device having an electric field directed from the illuminated surface of the solar cell towards the center of the body such that it causes minority carriers to drift away from the surface into the cell body.

It is another object of the present invention to provide contacts that collect the minority carriers efficiently from the body of the cell, thus eliminating current flow in thin surface layers.

It is a further object of the present invention to provide a solar cell in which the n+p− junction is at the interior of the device and which includes electric fields for directing minority carriers from the surface thereto for collection by the interior n+p− junction.

The foregoing and other objects of the invention are achieved by a solar cell formed of semiconductor material of one conductivity type material including an active region wherein carriers are generated by solar energy which impinges onto and penetrates the cell, said active region includes a graded impurity concentration extending from the surface where the solar energy impinges towards the center of the cell to set up an electric field in the device to transport generated minority carriers from the surface towards the center of the cell, a plurality of regions of opposite conductivity type extending into the device to form a n-p collecting junction to collect the minority carriers driven into the body by the electric field and means forming ohmic contact to said regions of opposite conductivity type and said one conductivity type.

BRIEF DESCRIPTION OF THE DRAWINGS

FIG. 1 is a sectional view of a solar cell in accordance with the prior art.

FIG. 2 shows the impurity concentration profile in the cell of FIG. 1.

FIG. 3 is a sectional view of a solar cell having a doping gradient to provide an extended drift field in accordance with the prior art.

FIG. 4 shows the impurity concentration profile in the cell of FIG. 3.

FIG. 5 shows a semiconductor wafer which includes an impurity gradient to provide a body directed field.

FIG. 6 shows a semiconductor solar cell having a body directed field and embodying the present invention.

FIGS. 7A-7G show the steps in fabricating a solar cell in accordance with one embodiment of the present invention.

FIGS. 8A-8F show the steps of fabricating a solar cell in accordance with another embodiment of the present invention.

DESCRIPTION OF PREFERRED EMBODIMENTS

FIGS. 1-4 have been described in the Background of the Invention and will not be described in additional detail.

Referring now to FIGS. 5 and 6, a semiconductor solar cell in accordance with the present invention is illustrated. The solar cell 11 of FIG. 5 shows a p-type body having a graded p-type layer extending from all surfaces 12 into the body or interior 13 of the cell body. Such a graded layer can be obtained by diffusing a p-type impurity into an unprotected semiconductor so that all surfaces are more heavily doped than the interior. Referring to the cell, the surface regions are shown as having p+ doping, while the center of the device is indicated as having p− doping with a gradient between the surface to the center. The electric fields generated by the graded surface to body regions are indicated by the arrows labeled $E_{BDF}$.

The effect of the graded layer shown in FIG. 5 is to produce a body directed field $E_{BDF}$ proceeding inward from every surface. This field will force electrons to drift to the interior of the cell and holes to drift to the heavily doped cell surfaces 12. In effect, this electric field provides at the front surface of the cell the same advantage that the back surface field provides in the cell of FIG. 1. By proper grading of the p-type doping, an extended field can also be developed so that electrons are transported efficiently forward a relatively thin p− layer 14 in the interior of the cell.

The body directed field thus solves the problem of separating holes and electrons efficiently at all surfaces. If then remains to make a low resistance contact so that electrons that are driven to the interior of the cell can be collected. This can be achieved by diffusing or ion implanting n+ impurities through an appropriate mask from one surface of the device so as to form n+ contact wells 16, FIG. 6, which extend through the graded p-type layer into the p− interior region 14. These wells are shown by the reference number 16 in FIG. 6 and have a width W and a separation L. The separation L is in the order of one diffusion length for electrons in the cell interior. Procedures for selecting the contact width W for a given spacing L so that efficiency is optimized are known to those skilled in the art and are described, for example, by James F. Gibbons and Frederick Wu in a paper entitled "Fabrication and Measurement of Silicon Cencentrator Solar Cells". Proc. International Cont. on Photovoltaic Solar Energy (p 242), Sept. 27-30, 1977, D. Riedel (Dordrecht/Boston), publishers. Thus, the inwardly directed electrons are collected by the n+p− junction formed by the n+ posts or wells with the adjacent p-type material. The electrons need not travel more than a distance corresponding to their diffusion length, over which distance the resistance is very low. Furthermore, the resistance for travel of the electrons is also low along the highly doped n+ post to the contacts 17 formed on the surface of the device. Thus, all the advantages of the graded field taught by the prior art and, in addition, the advantages of having no surface effects and very low device resistance are incorporated in the device illustrated in FIG. 6.

FIGS. 7A-7G illustrate the steps in forming a device having the characteristics of the device shown and described. In FIG. 7A there is illustrated a p-type wafer which may comprise silicon of low impurity concentration designated p−. It should be realized, however, that the present invention is applicable to structures which are constructed by beginning with wafers of the opposite conductivity type and is also applicable to other semiconductor elements or compounds thereof. The wafer 21 shown in FIG. 7A may, for example, be a moderately doped p-type wafer of resistivity of 1Ω−cm and having a minority carrier lifetime in the order of 100 μs. Thereafter a protective oxide layer 22 of about 1μ thickness is formed on one surface as, for example, by subjecting the wafer to an elevated termperature in an oxygen atmosphere.

A boron diffusion is then carried out to provide a p+ surface layer such as shown in FIG. 7C. This boron diffusion may comprise a predeposition of boron atoms on the surface followed by diffusion at an elevated temperature for a predetermined time. On the other hand, the wafer may be subject to an elevated temperature in an atmosphere containing boron atoms. In either case, boron will diffuse from the surface inwardly into the body of the wafer as illustrated in FIG. 7C. Preferably, the boron diffusion is carried out such that the surface concentration is in the order of $10^{20}/cm^3$ and the graded boron impurity profile extends on the order of 1 μm into the body. The required boron impurity profile can also be attained by ion implantation and annealing in a manner well known to those in the art.

The thick oxide layer 22 is then removed and a thinner oxide layer 23 in the order of 2000 Å is grown onto the surface. Boron is then implanted through this oxide at an energy of approximately 60 keV at a dose of approximately $2 \times 10^{13}/cm^3$. This will deposit approximately $10^{13}$ atoms/$cm^3$ in the silicon under conditions that provide a surface boron concentration of approximately $10^{18}/cm^3$. This is illustrated in FIG. 7D at 24.

Windows 26 are then cut into the oxide 23 as shown in FIG. 7E and n+ contact wells 27 are formed by diffusing phosphorus through the windows under conditions that provide a surface concentration of approximately $10^{20}/cm^3$ and a junction depth of approximately 0.5μm. A PO Cl$_3$ source operated at 950° C. for 10 minutes with an additional 10 minute drive-in will accomplish this diffusion. The implanted boron will be annealed during the n+ diffusion providing the required impurity gradient into the semiconductor body and reducing the surface boron concentration to between 2 and $3 \times 10^{17}/cm^3$.

For efficient operation, the windows must be spaced closely enough to provide minority carrier transport from the body to the contact wells. For a bulk electron lifetime of 100 μs and an electron diffusion coefficient of 25 cm²/sec, the spacing between contact wells should be approximately 400 μm. The width of the contact wells should be approximately 10 percent of the spacing to provide low contact resistance without blocking too much surface area which would result in loss of efficiency.

After the contact wells are formed, the oxide 23 may be removed and metal contacts 28 applied to the n+ wells and a metal contact 29 applied to the p+ back side in the manner known to those skilled in the art, FIG. 7G. An anti-reflection coating (not shown) may be applied to the front surface of the device.

An alternative embodiment and its construction is schematically shown in FIGs. 8A-8F. A p+ substrate or wafer 31 is the starting material. A p-type layer 52, approximately 40 μm thick, is grown on the p+ substrate or wafer 31, FIG. 8B. The growth is carried out so that a doping gradient is obtained from the p+ level down to a moderately high resistivity of approximately 1Ω—cm at the grown surface.

An n+ contact grid 33 approximately 0.5 microns thick, shown in FIG. 8C, is then prepared by ion implantation of arsenic through an appropriate mask and subsequent annealing. The wafer is then re-inserted in the epitaxial reactor and a second p-type layer 34 of variable doping from low impurity concentration is grown such as shown in FIG. 8D ending with a highly doped surface 36, FIG. 8E. This makes a device having a vertical mirror symmetry around the plane in which the n+ contacts 33 are prepared. The wafer is selectively etched to expose the upper surface of the grid whereby contact can easily be made to the upper surface of the n+ grid. A suitable contact 37 is made to the bottom of the solar cell.

Thus, it is seen that there has been provided a p-type solar cell in which surface effects are minimized by providing the n+ collecting regions at the interior of the device together with inwardly directed fields for directing minority carriers inwardly towards the center of the body toward the p-n junctions formed at the interior of the device. This lowers the resistivity of the device while overcoming recombination effects at the surface.

What is claimed is:

1. A solar cell formed of a body of semiconductor material of one conductivity type including an active region where carriers are generated by solar energy which impinges into and penetrates the cell, said active region having a graded impurity concentration extending at least from the surface where the solar energy impinges towards the center of said body whereby to transport generated minority carriers from the surface towards the center of the body, a plurality of spaced regions of opposite conductivity type having a high impurity concentration extending into the body to form an interior p-n collecting junction which collects the minority carriers transported toward the center of the body by the electric field and provides a low resistance path to the surface, and means of forming ohmic contact to said spaced regions of opposite conductivity type and to said body of one conductivity type.

2. A solar cell as in claim 1 wherein the spacing of said spaced regions of opposite conductivity type is such that substantially all minority carriers are collected by said p-n junction before they can recombine.

3. A solar cell as in claim 1 in which said graded impurity concentration extends from all surfaces toward the center of the body to transport minority carriers generated in the body toward the p-n collecting junction.

4. A solar cell as in claim 2 in which said spaced regions of opposite conductivity type extend inwardly from said surface toward the center.

5. A solar cell as in claim 1 in which said cell includes sides and said regions of opposite conductivity type extend inwardly from at least one side of said cell.

6. A solar cell as in claim 5 wherein said regions of opposite conductivity type are in the form of a grid.

7. A solar cell as in claim 5 in which said regions of opposite type are spaced such that substantially all minority carriers are collected at said p-n junction before they recombine.

* * * * *